United States Patent
Liao et al.

(10) Patent No.: US 9,824,733 B2
(45) Date of Patent: Nov. 21, 2017

(54) RESISTIVE MEMORY AND OPERATING METHOD FOR PERFORMING A FORMING OPERATION THEREOF

(71) Applicant: Winbond Electronics Corp., Taichung (TW)

(72) Inventors: Shao-Ching Liao, Taichung (TW); Ping-Kun Wang, Taichung (TW); Frederick Chen, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 14/918,574

(22) Filed: Oct. 21, 2015

(65) Prior Publication Data

US 2017/0117038 A1    Apr. 27, 2017

(51) Int. Cl.
  *G11C 11/00* (2006.01)
  *H01L 45/00* (2006.01)
  *G11C 5/14* (2006.01)
  *G11C 13/00* (2006.01)
  (Continued)

(52) U.S. Cl.
  CPC ............ *G11C 11/00* (2013.01); *G11C 5/147* (2013.01); *G11C 13/0002* (2013.01); *G11C 13/0007* (2013.01); *G11C 13/0069* (2013.01); *H01L 45/00* (2013.01); *G11C 11/5642* (2013.01); *G11C 11/5685* (2013.01);
  (Continued)

(58) Field of Classification Search
  CPC ............ G11C 13/0004; G11C 11/5685; G11C 11/5614; G11C 16/349; G11C 13/0002; G11C 5/147; G11C 13/0064; G11C 11/5642; H01L 27/2409
  See application file for complete search history.

(56) References Cited

U.S. PATENT DOCUMENTS

| 8,036,019 B2 | 10/2011 | Ma et al. |
| 2011/0038195 A1* | 2/2011 | Hamilton ............ B82Y 10/00 365/148 |

(Continued)

FOREIGN PATENT DOCUMENTS

WO    2014025434    2/2014

OTHER PUBLICATIONS

"Office Action of Taiwan Counterpart Application", dated Nov. 22, 2016, p. 1-p. 10, in which the listed references were cited.

*Primary Examiner* — Richard Elms
*Assistant Examiner* — Ajay Ojha
(74) *Attorney, Agent, or Firm* — JCIPRNET

(57) ABSTRACT

An operating method for a resistive memory cell and a resistive memory are provided. The operating method for the resistive memory cell includes following steps. A forming operation for the resistive memory cell is performed. Whether the resistive memory cell is in a first state is determined, wherein the first state is corresponding to a first operation. When the resistive memory cell is not in the first state, a complementary switching operation regarding a second operation for the resistive memory cell is performed, so that the resistive memory cell generates a complementary switching phenomenon regarding the second operation. Thus, the resistive memory cell which cannot retain data by normal forming operation can effectively obtain the data retention capability by the complementary switching phenomenon.

15 Claims, 4 Drawing Sheets

(51) Int. Cl.
  *G11C 11/56* (2006.01)
  *H01L 27/24* (2006.01)
(52) U.S. Cl.
  CPC .. *G11C 13/0064* (2013.01); *G11C 2013/0083* (2013.01); *H01L 27/2409* (2013.01)

(56) References Cited

U.S. PATENT DOCUMENTS

| | | | |
|---|---|---|---|
| 2011/0051508 A1* | 3/2011 | Eleftheriou | G11C 11/5678 365/163 |
| 2011/0110144 A1* | 5/2011 | Kawai | G11C 11/5685 365/148 |
| 2011/0188292 A1* | 8/2011 | Joo | G11C 13/0064 365/148 |
| 2011/0233509 A1* | 9/2011 | Shigeoka | H01L 27/2409 257/4 |
| 2011/0280059 A1* | 11/2011 | Xiao | G11C 13/0007 365/148 |
| 2012/0063195 A1* | 3/2012 | Lam | G11C 11/5642 365/148 |

* cited by examiner

RESISTIVE MEMORY AND OPERATING METHOD FOR PERFORMING A FORMING OPERATION THEREOF

BACKGROUND OF THE INVENTION

Field of the Invention

The invention relates to a resistive memory, and more particularly, relates to an operating method for a resistive memory cell and a resistive memory using the operating method.

Description of Related Art

Resistive memory (Resistive random-access memory; RRAM) is a new type of non-volatile memory which utilizes changes in resistance state to memorize or store values. Owing to high compatibility with the logic process as well as advantages of fast writing speed and lower writing voltage, the resistive memory can satisfy requirements of low power consumption for various portable electronic products.

A basic structure of a resistive memory cell commonly used in the resistive memory is constituted by one transistor and one resistive memory (1T1R) or one diode plus one resistive memory (1D1R). In the resistive memory, three operations (forming, set and reset) are the three important steps for ensuring an electrical property and a data retention capability of the resistive memory cell. Optimized adjustment for the forming, set and reset operations is an important factor for improving a yield rate of the resistive memory. Particularly, for a conductive filament (CF) generated by performing the forming operation, said operation for generating the conductive filament has great influence to the operations of the resistive memory.

In general, after the in-depth forming operation is performed, most of the resistive memory cells should successfully be in a data logic 1 state (i.e., a high current state/a set state). However, a few number of the resistive memory cells with defect may be in a data logic 0 state (i.e., a low current state/a reset state) after the forming operation is performed. As a capacity of a device using the resistive memory grows larger, an amount of said resistive memory cells with defect will increase. Later, after a high temperature baking operation is performed multiple times on the resistive memory cells, it is possible that the resistive memory cells with defect cannot be used at all since the data retention capability may further deteriorate. Therefore, a repairing operation performed specifically for the resistive memory cells with defect is the key issue for improving the yield rate of the resistive memory.

SUMMARY OF THE INVENTION

The invention is directed to an operating method for a resistive memory cell and a resistive memory, which is capable of allowing the resistive memory cell which cannot retain data by normal forming operation to effectively obtain the data retention capability by the complementary switching phenomenon.

The operating method for the resistive memory cell of the invention includes following steps. A forming operation for the resistive memory cell is performed. Whether the resistive memory cell is in a first state is determined, wherein the first state is corresponding to a first operation. When the resistive memory cell is not in the first state, a complementary switching operation regarding a second operation for the resistive memory cell is performed, so that the resistive memory cell generates a complementary switching phenomenon regarding the second operation.

The resistive memory of the invention includes a plurality of resistive memory cells, a word line signal providing circuit, a bit line signal providing circuit, a source line signal providing circuit and a control circuit. The word line signal providing circuit is coupled to word lines of the resistive memory cells. The bit line signal providing circuit is coupled to bit lines of the resistive memory cells. The source line signal providing circuit is coupled to source lines of the resistive memory cells. The control circuit is coupled to the word line signal providing circuit, the bit line signal providing circuit and the source line signal providing circuit. The control circuit performs a forming operation of the resistive memory cells through the word line signal providing circuit, the bit line signal providing circuit and the source line signal providing circuit, and determines whether each of the resistive memory cells is in a first state. When a selected resistive memory cell is not in the first state, the control circuit performs a complementary switching operation regarding a second operation for the resistive memory cell through the word line signal providing circuit, the bit line signal providing circuit and the source line signal providing circuit, so that the selected resistive memory cell generates a complementary switching phenomenon regarding the second operation. The selected resistive memory cell is one of the plurality of resistive memory cells.

Based on the above, according to the embodiments of the invention, after the forming operation is performed for each of the resistive memory cells, whether the resistive memory cells not in the set state are present is then determined, and the set state is a state usually formed after the forming operation is performed for the resistive memory cell. If the resistive memory cells are not in the set state after the forming operation is performed, the complementary switching operation regarding the reset operation is performed for the resistive memory cells in the invention. Thus, the resistive memory cell which cannot retain data by normal forming operation can effectively obtain or maintain the data retention capability by the complementary switching phenomenon.

To make the above features and advantages of the present disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
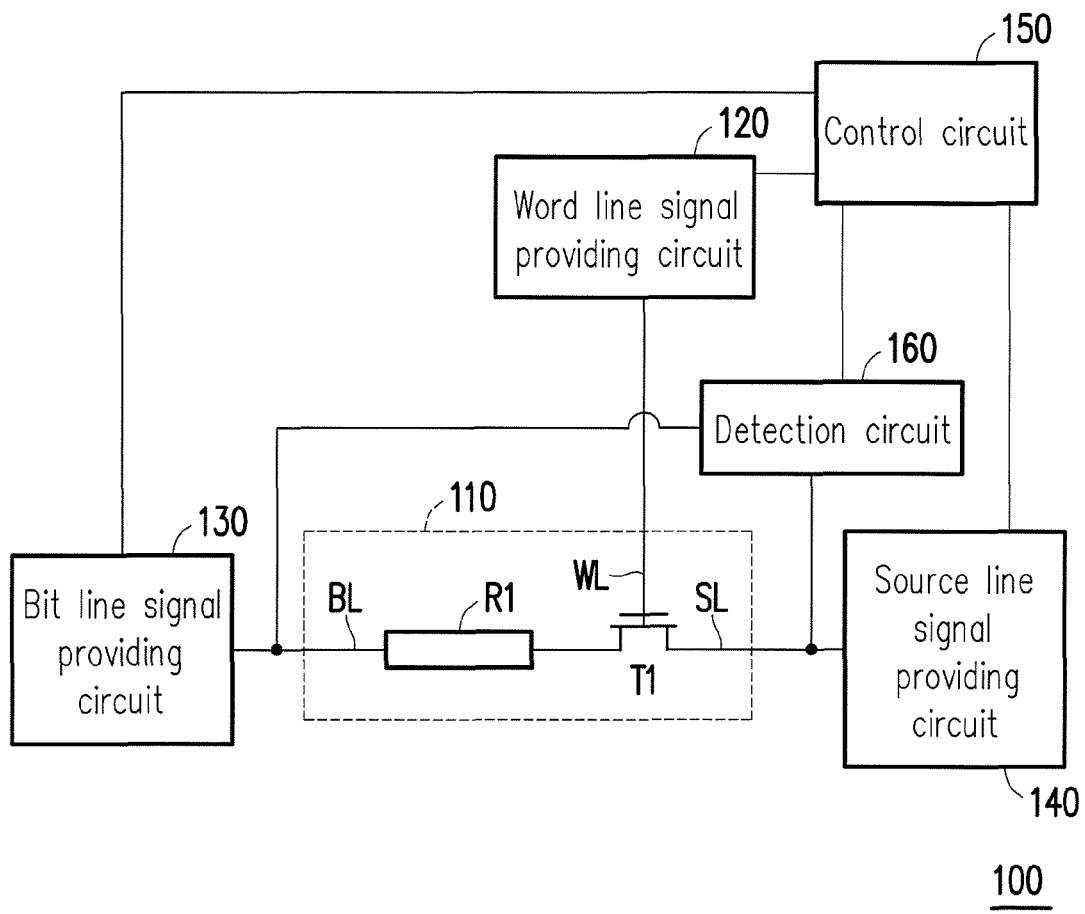
FIG. 1 illustrates a schematic diagram of a resistive memory in an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a schematic diagram of a resistive memory 100 in an embodiment of the invention. The resistive memory 100 includes a plurality of resistive memory cells 110, a word line signal providing circuit 120, a bit line signal providing circuit 130, a source line signal providing circuit 140 and a control circuit 150. In the present embodiments, only one of the resistive memory cells 110 is illustrated in FIG. 1 as an example. The word line signal providing circuit 120 is coupled to a word line WL of the resistive memory cell 110, the bit line signal providing circuit 130 is coupled to a bit line BL of the resistive memory cell 110, and the source line signal providing circuit 140 is coupled to a source line SL of the resistive memory cell 110. The control circuit 150 is coupled to the word line signal providing circuit 120, the bit line signal providing circuit 130 and the source line signal providing circuit 140, so as to perform various operations for the resistive memory 110, such as the three important operations (foaming, set and reset) and a complementary switching operation described in the embodiments of the invention.

The resistive memory 100 further includes a detection circuit 160. The detection circuit 160 is coupled to each of the resistive memory cells 110. The control circuit 150 detects a current value in the resistive memory cell 110 through the detection circuit 160, so as to determine whether a state in the resistive memory cell 110 is the set state/the data logic 1 state or the reset state/the data logic 0 state.

FIG. 1 also illustrates a structure of the resistive memory cell 110. The resistive memory cell 110 includes a switch device T1 and a resistive memory device R1. The switch device T1 may be a CMOS (complementary metal-oxide-semiconductor) transistor. The resistive memory device R1 may be a memristor (also known as a memory resistor) which consists of an insulating or a semiconducting material sandwiched between two conductive electrodes like a MIM (metal-insulator-metal) structure. In the present embodiment, a first terminal of the resistive memory device R1 is coupled to the bit line BL, a control terminal of the switch device T1 is coupled to the word line WL, a first terminal of the switch device T1 is coupled to a second terminal of the resistive memory device R1, and a second terminal of the switch device T1 is coupled to the source line SL. Based on actual requirements, persons who applying the present embodiment may freely adjust an interconnection structure regarding the multiple signal lines (the bit line BL, the word line WL and source line SL) with respect to the switch device T1 and the resistive memory device R1 in the resistive memory cell 110, and the structure of the resistive memory cell 110 is not limited only by the foregoing disclosure.

Figure 2:
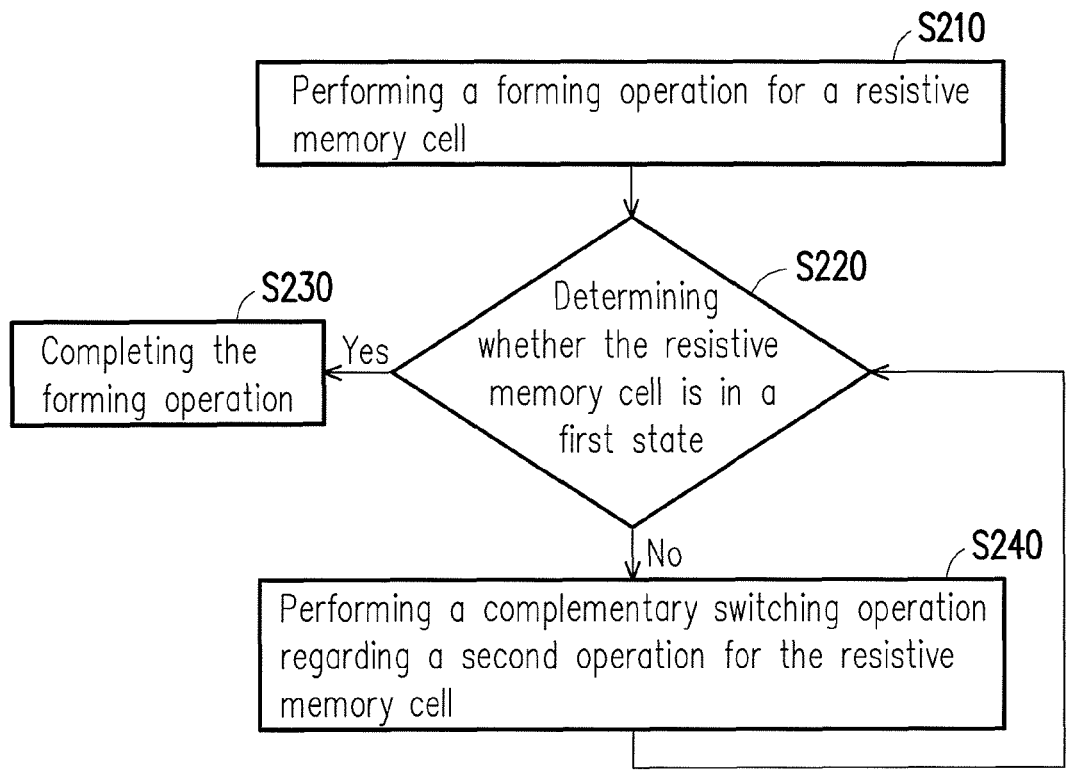
FIG. 2 illustrates a flowchart of an operating method for a resistive memory cell in an embodiment of the invention.

FIG. 2 illustrates a flowchart of an operating method for a resistive memory cell 110 in an embodiment of the invention. Referring to FIG. 1 and FIG. 2 together, in step S210, the control circuit 150 performs a forming operation for the resistive memory cell 110 through the word line signal providing circuit 120, the bit line signal providing circuit 130 and the source line signal providing circuit 140. The so-called forming operation refers to an action of applying a higher bias to the resistive memory cell, so that the resistive memory cell generates a soft breakdown phenomenon to form a conductive filament in the resistive memory cell. After the forming operation is performed, a switching action of the resistance may be performed for the resistive memory cell 110 according to the set operation and the reset operation, so as to perform functions of data writing.

However, the forming operation may encounter some unpredictable issues. In general, the resistive memory cell should be in a high current state after the forming operation is performed, and such high current state may also be referred to as the set state or the data logic 1 state. Nonetheless, it is possible that a few number of the resistive memory cells cannot be in the set state by the forming operation, or cannot reach a high current amount standard required by the set state. Said few number of the resistive memory cells are known as the resistive memory cells with defect. As an amount of the resistive memory cells in the resistive memory become larger, an amount of the resistive memory cells with defect also increases correspondingly. Based on experimental data, it can be learned that 2 to 3 resistive memory cells may be included per one million resistive memory cells 110.

In addition, after a high temperature baking operation is performed on the common resistive memory cells, conductive paths known as the conductive filament may become more stable, so as to maintain the data retention capability of the resistive memory cells. But, after the high temperature baking operation is performed, the data retention capability of the resistive memory cell with defect may be reduced even more, resulting in loss of data.

On the other hand, a complementary switching phenomenon is one unique phenomenon in the technical field of the resistive memory that can be generated while performing either the set operation or the reset operation. If a value of an input voltage is adjusted to be overly high while performing the set operation for the resistive memory cell 110, a current value detected in the resistive memory cell 110 may be overly small.

Figure 3:
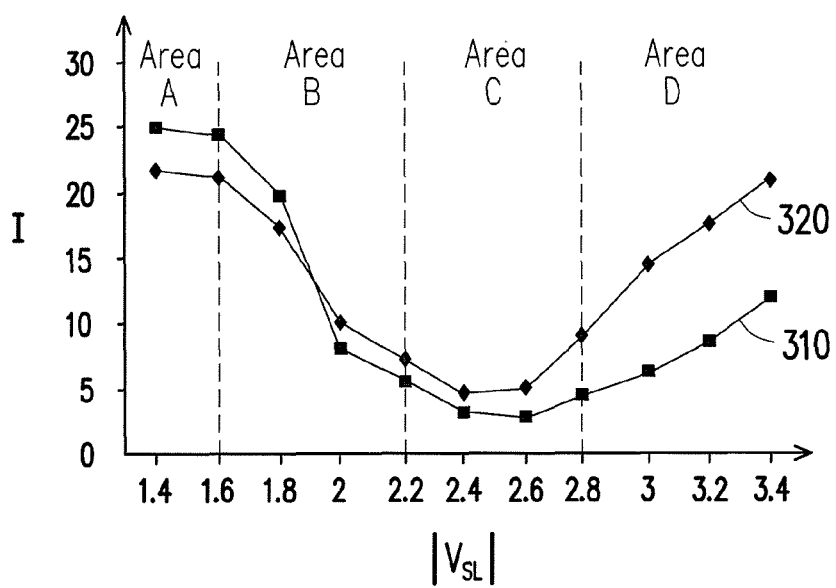
FIG. 3 illustrates a schematic diagram of a complementary switching phenomenon regarding the reset operation.

FIG. 3 illustrates a schematic diagram of a complementary switching phenomenon regarding the reset operation. A horizontal axis in FIG. 3 represents a voltage value $|V_{SL}|$ of the resistive memory cell 110, and a vertical axis of FIG. 3 represents a reset current value I measured from the resistive memory cell 110. Referring to FIG. 3, a curve 310 shows values of the voltage value $|V_{SL}|$ and the corresponding reset current value I of the resistive memory cell 110 before the high temperature baking operation is performed, and a curve 320 shows the values of the voltage value $|V_{SL}|$ and the corresponding reset current value I of the resistive memory cell 110 after the high temperature baking operation is performed. In view of FIG. 3, the reset current value I decreases as the voltage value $|V_{SL}|$ increases from an area A to an area C, such that the desired reset operation may be achieved. However, in an area D, as the voltage value $|V_{SL}|$ becomes greater than approximately 2.8V, the reset current value I increases instead. Therefore, if the value of the input voltage (e.g., the voltage value $|V_{SL}|$) is adjusted to be overly high while performing the reset operation for the resistive memory cell 110, the current value detected from the resistive memory cell 110 may be getting larger. The complementary switching phenomenon may also be referred to as a U-curve phenomenon.

Accordingly, in the embodiments of the invention, the resistive memory cells with defect are selected after the forming operation is performed, and the complementary switching operation regarding the reset operation is performed for the resistive memory cells with defect to allow the resistive memory cells with defect to be in the area D (i.e., a complementary switching area) of FIG. 3, such that the resistive memory cells with defect may regenerate the conductive filament under high electric field to establish the conductive paths. Further, if the high temperature baking process is performed again on the resistive memory cells after the complementary switching operation is performed, the amount of the conductive filament may increase so that the resistive memory cells with defect can obtain the data retention capability.

Referring back to FIG. 1 and FIG. 2, the embodiments of the invention will be described in more detail as follows. In step S220, the control circuit 150 determines whether the resistive memory cell 110 is in a first state through the detection circuit 160, wherein the first state is corresponding to a first operation. In the present embodiment, the so-called first state may be the high current state/set state/the data logic 1 state, and the second state may be the low current state/reset state/the data logic 0 state. The first operation may be the forming operation/the set operation, and the second operation may be the reset operation.

Step S220 will be described in detail below. The control circuit 150 determines whether a current value in the resistive memory cell 110 is greater than a preset current threshold through the detection circuit 160. When the current value in the resistive memory cell 110 is greater than the preset current threshold, proceeding from step S220 to step S230, where it indicates that the forming operation for the resistive memory cell 110 is completed. In contrast, when the current value in the resistive memory cell 110 is not greater than the preset current threshold, the detection circuit 150 determines that the corresponding resistive memory cell 110 is not in the set state, and uses such resistive memory cell 110 as a selected resistive memory cell. Thereafter, proceeding from step S220 to step S240, where the control circuit 150 performs a complementary switching operation regarding a second operation (the reset operation) for the resistive memory cell 110 through the word line signal providing circuit 120, the bit line signal providing circuit 130 and the source line signal providing circuit 140, so that the resistive memory cell 110 can generate a complementary switching phenomenon regarding the second operation (the reset operation). Further, in the present embodiment, after step S240 is completed, the control circuit 150 may also return back to step S220 in order to determine whether the resistive memory cell 110 is in the first state (the set operation) again, so as to improve the present embodiment of the invention.

Figure 4:
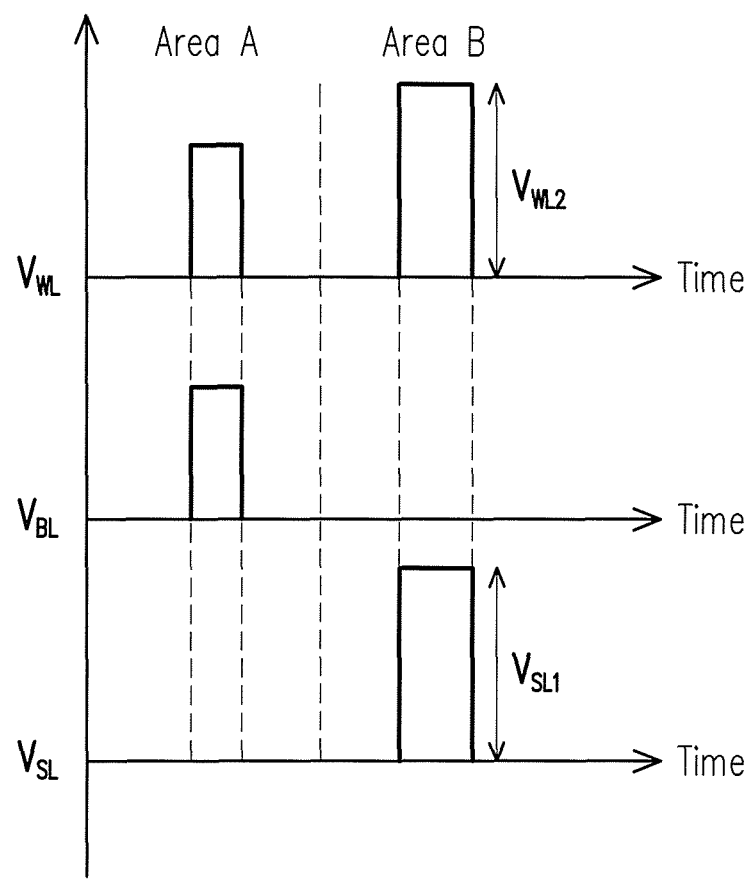
FIG. 4 illustrates a schematic diagram of waveforms in the forming operation and the complementary switching phenomenon regarding the reset operation in an embodiment of the invention.

Hereinafter, the complementary switching operation regarding the second operation (the reset operation) in step S240 is described in more detail with reference to FIG. 4. FIG. 4 illustrates a schematic diagram of waveforms in the forming operation and the complementary switching phenomenon regarding the reset operation in an embodiment of the invention. In FIG. 4, an area A refers to waveforms of a word line voltage $V_{WL}$, a bit line voltage $V_{BL}$ and a source line voltage $V_{SL}$ when the forming operation for the resistive memory cell 110 is performed. In view of FIG. 1 and FIG. 4, during the forming operation, the control circuit 150 controls the word line signal providing circuit 120 and the bit line signal providing circuit 130 to provide a forward voltage to the word line WL and the bit line BL of the resistive memory cell 110, and the control circuit 150 controls the source line signal providing circuit 140 to provide a reference voltage to the source SL. An area B of FIG. 4 refers to waveforms of the word line voltage $V_{WL}$, the bit line voltage $V_{BL}$ and the source line voltage $V_{SL}$ when the complementary switching operation regarding the reset operation for the resistive memory cell 110 is performed. In view of FIG. 1 and FIG. 4, during the complementary switching operation regarding the reset operation, the control circuit 150 controls the word line signal providing circuit 120 to provide a first voltage $V_{WL2}$ to the word line WL of the resistive memory cell 110, controls the bit line signal providing circuit 130 to provide a ground voltage to the bit line BL, and controls the source line signal providing circuit 140 to provide a second voltage $V_{SL1}$ to the source line SL.

It should be noted that, in the complementary switching operation regarding the reset operation, the voltage value of the first voltage $V_{WL2}$ will be maximized according to a range within which the switch device T1 can endure. For example, the voltage value of the first voltage $V_{WL2}$ will be greater than 3V. In addition, in order to turn on the switch device T1 of FIG. 1 in the complementary switching operation, the first voltage $V_{WL2}$ will be greater than the second voltage $V_{SL1}$ by a preset voltage value (e.g., 2V). In other words, the voltage value of the first voltage $V_{WL2}$ is equal to or greater than the voltage value of the second voltage $V_{SL1}$ plus 2V. On the other hand, the voltage value of the second voltage $V_{SL1}$ may be fixed, and the complementary switching operation regarding to the reset operation may be performed multiple times by using the voltage value of the maximized first voltage $V_{WL2}$; or, the voltage value of the second voltage $V_{SL1}$ may be gradually increased, and the complementary switching operation regarding to the reset operation may be performed multiple times by using the voltage value of the maximized first voltage $V_{WL2}$.

In other embodiments, the complementary switching phenomenon may also occur in the set operation. Accordingly, the first state may also be the reset state/the data logic 0 state, and the second state may also be the set state/the data logic 1 state. The first operation may be the reset operation, and the second operation may be the set operation. Accordingly, such operating method of the resistive memory may also allow the resistive memory cell which cannot retain data by normal forming operation to effectively obtain the data retention capability by the complementary switching phenomenon.

Figure 5:
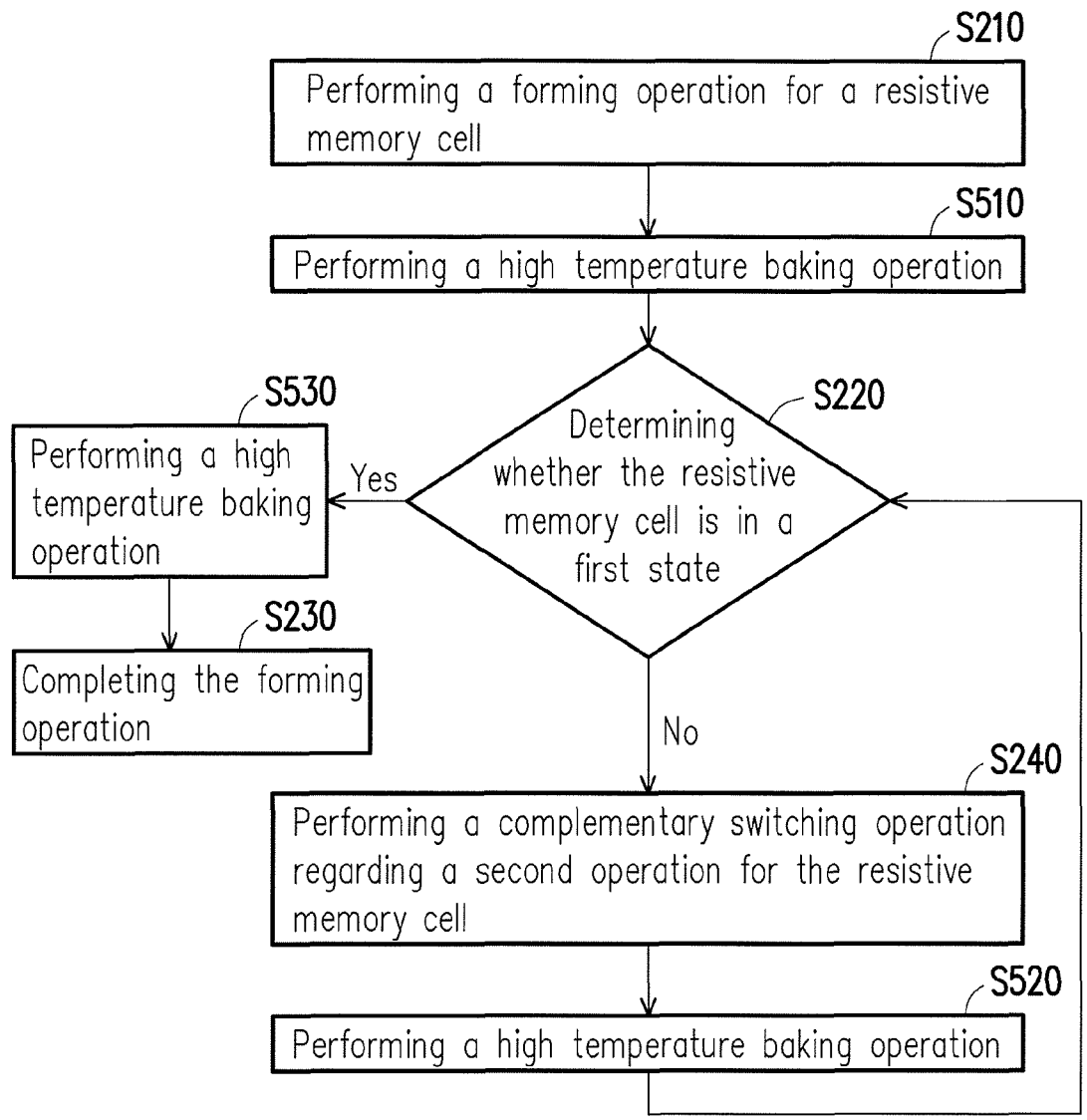
FIG. 5 illustrates a flowchart of an operating method for a resistive memory cell in another embodiment of the invention.

FIG. 5 illustrates a flowchart of an operating method for a resistive memory cell 110 in another embodiment of the invention. A difference between FIG. 5 and FIG. 2 is that, the control circuit 150 of FIG. 1 may further perform a high temperature baking operation (steps S510, S520 and S530) for the resistive memory cell before step S210, step S240 and/or step S230 to thereby improve a current gain of the resistive memory cell 110, so as to improve the data retention capability of the resistive memory cell 110. Persons who applying the present embodiment can selectively perform one of the steps S510, S520 and S530 or a combination thereof, and the embodiments of the invention are not intended to limit that the high temperature baking operation must be performed before or after particular step(s).

In summary, according to the embodiments of the invention, after the forming operation is performed for each of the resistive memory cells, whether the resistive memory cells not in the set state are present is then determined, and the set state is a state usually formed after the forming operation is performed for the resistive memory cell. If the resistive memory cells are not in the set state after the forming operation is performed, the complementary switching operation regarding the reset operation is performed for the resistive memory cells in the invention. Thus, the resistive memory cell which cannot retain data by normal forming operation can effectively obtain or maintain the data retention capability by the complementary switching phenomenon.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. An operating method for a resistive memory cell, comprising:
    performing a forming operation for the resistive memory cell, wherein the forming operation is an action of applying a bias to the resistive memory cell to form a conductive filament in the resistive memory cell, wherein a ground voltage is provided to a source line of the resistive memory cell during the forming operation;
    determining whether the resistive memory cell is in a first state, wherein the first state is corresponding to a first operation, a second state is opposite to the first state, and the second state is corresponding to a second operation; and
    when the resistive memory cell is not in the first state, performing a complementary switching operation regarding the second operation for the resistive memory cell, so that the resistive memory cell generates a complementary switching phenomenon regarding the second operation, wherein the step of performing the complementary switching operation for the resistive memory cell comprises:
        providing a first voltage to a word line of the resistive memory cell, providing a second voltage to the source line of the resistive memory cell, and providing the ground voltage to a bit line of the resistive memory cell,
    wherein the complementary switching operation regarding the second operation is performed to the resistive memory cell to adjust a state of the resistive memory cell into the first state.

2. The operating method for the resistive memory cell of claim 1,
    wherein the first voltage is greater than the second voltage by a preset voltage value.

3. The operating method for the resistive memory cell of claim 1, wherein the resistive memory cell comprises:
    a resistive memory device, having a first terminal coupled to the bit line; and
    a switch device, having a control terminal coupled to the word line, a first terminal coupled to a second terminal of the resistive memory device, and a second terminal coupled to the source line.

4. The operating method for the resistive memory cell of claim 1, wherein the first state is a set state, the second state is a reset state, the first operation is a set operation, and the second operation is a reset operation.

5. The operating method for the resistive memory cell of claim 1, wherein the step of determining whether the resistive memory cell is in the first state comprises:
    determining whether a current value in the resistive memory cell is greater than a preset current threshold; and
    when the current value is not greater than the preset current threshold, determining that the resistive memory cell is not in the first state.

6. The operating method for the resistive memory cell of claim 1, further comprising:
    after performing the complementary switching operation regarding the second operation for the resistive memory cell, determining whether the resistive memory cell is in the first state again.

7. The operating method for the resistive memory cell of claim 1, further comprising:
    performing a high temperature baking operation for the resistive memory cell.

8. A resistive memory, comprising:
    a plurality of resistive memory cells;
    a word line signal providing circuit, coupled to word lines of the resistive memory cells;
    a bit line signal providing circuit, coupled to bit lines of the resistive memory cells;
    a source line signal providing circuit, coupled to source lines of the resistive memory cells; and
    a control circuit, coupled to the word line signal providing circuit, the bit line signal providing circuit and the source line signal providing circuit, wherein the control circuit performs a forming operation of the resistive memory cells through the word line signal providing circuit, the bit line signal providing circuit and the source line signal providing circuit, and determines whether each of the resistive memory cells is in a first state, wherein the first state is corresponding to a first operation, a second state is opposite to the first state, the second state is corresponding to a second operation, and the forming operation is an action of applying a bias on the resistive memory cell to form a conductive filament in the resistive memory cell, wherein a ground voltage is provided to a source line of the resistive memory cell during the forming operation,
    when a selected resistive memory cell is not in the first state, the control circuit performs a complementary switching operation regarding the second operation for the resistive memory cell through the word line signal providing circuit, the bit line signal providing circuit and the source line signal providing circuit, so that the selected resistive memory cell generates a complementary switching phenomenon regarding the second operation, wherein the complementary switching operation regarding the second operation is performed to the resistive memory cell to adjust a state of the resistive memory cell into the first state, and the selected resistive memory cell is one of the resistive memory cells,
    wherein the control circuit provides a first voltage to the word line of the selected resistive memory cell through the word line signal providing circuit, provides a second voltage to the source line of the selected resistive memory cell through the source line signal providing circuit, and provides the ground voltage to the bit line of the selected resistive memory cell through the bit line signal providing circuit.

9. The resistive memory of claim 8, wherein the first voltage is greater than the second voltage by a preset voltage value.

10. The resistive memory of claim 9, wherein each of the resistive memory cells comprises:
    a resistive memory device, having a first terminal coupled to the bit line; and a switch device, having a control terminal coupled to the word line, a first terminal coupled to a second terminal of the resistive memory device, and a second terminal coupled to the source line.

11. The resistive memory of claim 8, further comprising:
a detection circuit, coupled to each of the resistive memory cells, wherein the control circuit determines whether a current value in each of the resistive memory cells is greater than a preset current threshold through the detection circuit,
when the current value is not greater than the preset current threshold, the detection circuit determines that the corresponding resistive memory cell is not in the first state, and uses the corresponding resistive memory cell as the selected resistive memory cell.

12. The resistive memory of claim 8, wherein the first state is a set state, the second state is a reset state, the first operation is a set operation, and the second operation is a reset operation.

13. The resistive memory of claim 8, wherein after performing the complementary switching operation regarding the second operation for the resistive memory cell, the control circuit determines whether the resistive memory cell is in the first state again.

14. The resistive memory of claim 8, wherein a high temperature baking operation is performed for the resistive memory cell.

15. An operating method for a resistive memory cell, comprising:

performing a forming operation for the resistive memory cell, wherein the forming operation is an action of applying a bias to the resistive memory cell to form a conductive filament in the resistive memory cell, wherein a ground voltage is provided to a source line of the resistive memory cell during the forming operation;

determining whether the resistive memory cell is in a first state wherein the first state is corresponding to a first operation, a second state is opposite to the second state, and the second state is corresponding to a second operation; and when the resistive memory cell is not in the first state, performing a complementary switching operation regarding the second operation for the resistive memory cell, so that the resistive memory cell generates a complementary switching, wherein the step of performing the complementary switching operation for the resistive memory cell comprises:
providing a first voltage to a word line of the resistive memory cell, providing a second voltage to the source line of the resistive memory cell, and providing the ground voltage to a bit line of the resistive memory cell, wherein the complementary switching operation regarding the second operation is performed to the resistive memory cell to adjust a state of the resistive memory cell into the first state.

* * * * *